United States Patent

Tanga et al.

[11] Patent Number: 5,935,323
[45] Date of Patent: Aug. 10, 1999

[54] ARTICLES WITH DIAMOND COATING FORMED THEREON BY VAPOR-PHASE SYNTHESIS

[75] Inventors: Michifumi Tanga; Takahiro Kitagawa, both of Yamaguchi-ken, Japan

[73] Assignee: Toyo Kohan Co., Ltd., Tokyo, Japan

[21] Appl. No.: 08/945,212

[22] PCT Filed: Apr. 18, 1996

[86] PCT No.: PCT/JP96/01052

§ 371 Date: Mar. 20, 1998

§ 102(e) Date: Mar. 20, 1998

[87] PCT Pub. No.: WO96/34131

PCT Pub. Date: Oct. 31, 1996

[30] Foreign Application Priority Data

Apr. 24, 1995 [JP] Japan .................................. 7-124373

[51] Int. Cl.$^6$ .................................................. G30B 25/04
[52] U.S. Cl. .............................. 117/79; 117/95; 117/923; 423/446; 427/255.6
[58] Field of Search .............................. 117/92, 95, 103, 117/904, 905, 79, 923; 423/446; 427/70, 249, 255.6

[56] References Cited

U.S. PATENT DOCUMENTS

| | | | |
|---|---|---|---|
| 5,413,772 | 5/1995 | Pinneo | 423/446 |
| 5,614,140 | 3/1997 | Pinneo | 264/81 |
| 5,635,243 | 6/1997 | Turchan et al. | 427/248 |
| 5,648,127 | 7/1997 | Turchan | 427/596 |
| 5,707,409 | 1/1998 | Martin et al. | 51/295 |

FOREIGN PATENT DOCUMENTS

| | | |
|---|---|---|
| 5-097582 | 4/1993 | Japan . |
| 5-311442 | 11/1993 | Japan . |
| 6-183890 | 7/1994 | Japan . |

*Primary Examiner*—Felisa Hiteshew
*Attorney, Agent, or Firm*—Brwody and Neimark

[57] ABSTRACT

Articles with a tenaciously adherent diamond coating are made by forming a diamond coating on a base material by vapor-phase synthesis without causing any warpage of the coating. The diamond coating layer is formed on the surface of a base material having a number of pores formed by electric discharge or laser beams and having a depth of 0.0001–0.2 mm and a diameter of 0.001–0.02 mm. The pores may be connected to one another to form a groove. Suitable examples of the base material include molybdenum, tungsten, silicon, tungsten carbide, silicon carbide, silicon nitride, and cemented carbide mainly comprising tungsten carbide and cobalt and/or nickel.

17 Claims, 2 Drawing Sheets

ARTICLES WITH DIAMOND COATING FORMED THEREON BY VAPOR-PHASE SYNTHESIS

FIELD OF INVENTION

The present invention relates to a base material covered with a diamond coating and the manufacturing process thereof which is used of recutting tools such as cutting chips, drills, and end mills, whetstone tools, and wear resistant abrasion tools. Particularly, it relates to a diamond coated material and the manufacturing process thereof, which diamond coated material has no warpage, flat shape and tenacious adherence with a base material, by dispersion reduction of internal stress provided in the diamond coating during forming.

BACKGROUND

According to the development of vapor-phase synthesis of diamond, development of diamond coating tools formed by vapor-phase synthesis has been actively pursued, wherein diamond material has been coated on a base material for tools such as cutting chips, drills, and end mills. In the case of directly coating the diamond on a base material for a tool by direct vapor-phase synthesis, the diamond coating may peel off from the base material depending on the method due to the stress resulting from thermal expansion coefficient difference between the materials of the base material and diamond, that is to say, residual stress produced from temperature difference during coating of the diamond on the base material, during cooling after coating, and therefore the productis deficient for practical usage. On the other hand, diamond material has been coated in advance on a specific base material by vapor-phase synthesis, and then the base material covered with the diamond coating obtained has been soldered directly attaching the base material and tool; or the base material has been removed by polishing after soldering, directly attaching the diamond surface and tool; or the diamond coating alone has been soldered to the tool after peeling the diamond coating from the diamond coated base material. In these methods, the thicker the diamond coating is, the more the residual stress increases, and in case of a thin base material, warpage occurs of the base material covered with the diamond coating. Once warpage occurs, troubles increase such as a longer polishing time is required to polish the coating surface, or the diamond coating is easily cracked during soldering to the tool. For example, laid-open Japanese patents Hei 1-167211, Hei 3-197677, and Hei 4-992278 disclose that formation of the coating is carried out in plural steps in order to improve tenacious adherence during forming of the diamond coating on the base material, and so the precipitated coating has a multilayered structure. Moreover, laid-open Japanese patent Hei-306195 proposes prevention of warpage of the coating during forming the diamond coating.

Laid-open Japanese patent Hei 1-167211 discloses a diamond-like carbon coating and the synthesis thereof having small coating stress and smooth surface flatness comprising diamond like carbon layer including a high content of amorphous carbon and that include a low content of amorphous carbon. The objective of this patent is to obtain a diamond like carbon layer having a flat surface and high light transmissivity for coating of a lens or window and providing a protective film for a magnetic disk, and it produces a coating of diamond like carbon formed by alternate precipitation of diamond like carbon layer including a high content of amorphous carbon and that includes a low content of amorphous carbon was obtained by periodically changing the temperature of the base material, electromagnetic wave energy such as microwave and high frequency, concentration of carbon source, and reaction pressure. However, the objective of this patent is to obtain a diamond like carbon layer having flat surface and high light transmissivity, and in order to obtain a coating having smooth surface flatness without surface polishing such as lapping after forming coating, the uppermost surface layer needs to have smooth surface flatness but to have low hardness of diamond like carbon layer including high content of amorphous carbon; and therefore it is not suitable for use as a hard coating layer for a tool due to insufficient wear resistance, which is the objective of the present invention.

Laid-open Japanese patent Hei 3-197677 is discloses a diamond coated tool and the manufacturing process thereof which has multilayers of diamond layer coated on the base material such as cemented carbide, cermet, silicon nitride sintering, or aluminum oxide sintering, in which the impurity content of the first layer is higher than that of the second layer and in which grain size of diamond of the first layer is smaller than that of the second layer. This patent needs different processes for formation, respectively, in which the coating of the first layer is formed by filament CVD, and then the coating of the second layer is formed by plasma CVD. Therefore, it has some problems, for example, slow productivity and the possibility of forming defects in the second layer due to deposition of impurity such as particles of dust on the coating surface after forming the first layer.

Laid-open Japanese patent Hei 4-99278 discloses a diamond coated tool having multilayered diamond coating layer having a thickness of 0.5–200 μm formed on a hard material, which has not less than one layer of the diamond coating icluding a carbon component except for diamond, and not less than one layer without it, respectively. This patent intends to relax the impact of the whole coating layer received and to have peeling resistance and wear resistance at the same time by forming a high toughness diamond layer including a carbon component as amorphous carbon type which is the same component as diamond between (1) the diamond layer without carbon component except for diamond and (2) the base material. However, stress formed into the coating increases as the thickness of the coating increases; therefore, this system has a problem that the coating is easy to peel off.

Laid-open Japanese patent Hei 5-306195 discloses a manufacturing process of CVD diamond thin film having internal tensile stress released and flatness, because the forming surface of the base material for the precipitated diamond coating is a convex shape having a curvature diameter which compensates for internal tensile stress foreseeable in the diamond thin film obtained by removal from the base material, whereby the thin film removed from the base material warps in an opposite direction of the curvature of base material. A characteristic of this patent is to foresee the degree of warpage of the coating formed by internal stress in the coating during precipitation of the diamond coating on the base material beforehand and to carry out the coating of the base material as a convex shape for compensating warpage of the coating beforehand in order to be a flat layer after releasing internal stress by removing the coating from the base material. However, it is lacking in practical use, since the forming condition of the diamond coating should precisely be controlled due to the shape of the convex base material for the reason that internal stresses created in the coating vary depending on the forming equipment and the forming conditions, for example, the greater the forming velocity of a coating, the greater the internal stress which is created in the coating.

SUMMARY OF THE INVENTION

The objective of the present invention is to produce a tenaciously adherent diamond coated material in which a diamond coating is formed by vapor-phase synthesis on a base material without causing any warpage of the coating.

The diamond coated material of the present invention has a diamond coating layer formed by vapor-phase synthesis on a surface of a base material having a number of pores as cavities.

The pores or cavities are preferably formed by electric discharge or laser beam irradiation and preferably have a depth of 0.0001–0.2 mm, especially 0.01–0.15 mm and a diameter of 0.001–0.2 mm, especially, not more than 0.01–0.1 mm.

Moreover, the pores are preferably connected to one another to form a groove.

Suitable examples of the base material also include any one of the molybdenum, tungsten, silicon, tungsten carbide, silicon carbide, silicon nitride, and cemented carbide mainly comprising tungsten carbide and cobalt and/or nickel.

In the present invention, it has been possible to obtain a drained coated material having tenacious adhesion with a base material by an anchoring effect produced by forming a diamond coating by vapor-phase synthesis on a base material, the base material having a number of pores formed by electric discharge or laser beam irradiation.

DETAILED DESCRIPTION OF THE INVENTION

Figure 1:
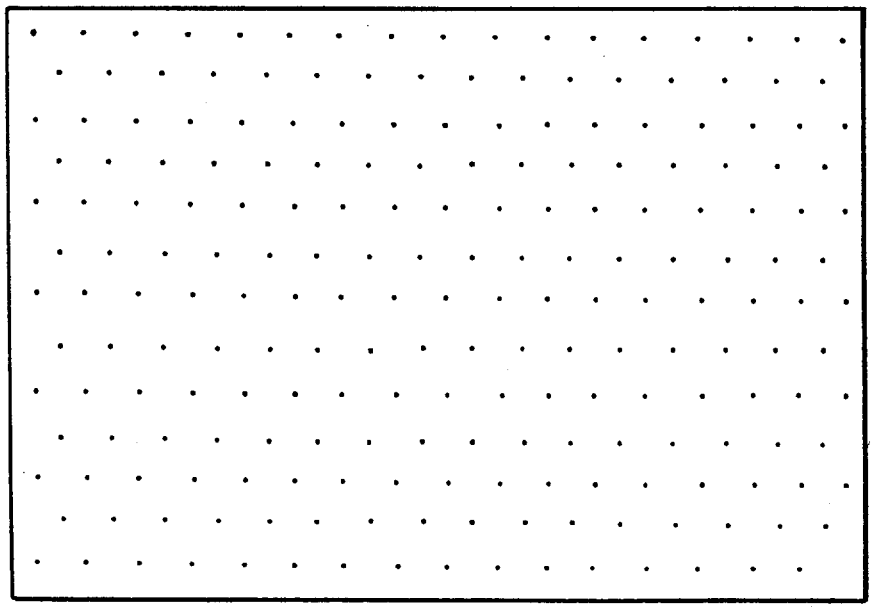
FIG. 1 is a pattern of points arranged as zigzag which are illustrated on a base material.

The present invention will be described in further detail by examples mentioned below.

A usable base material for forming a diamond coating thereon by vapor-phase synthesis in the present invention includes metal such as silicon, molybdenum, tungsten, niobium, iron, copper, silver, gold, platinum, manganese, nickel, cobalt, tantalum, titanium, chromium, and zirconium, nonmetallic simple substance such as boron and graphite, carbide such as silicon carbide, tungsten carbide, titanium carbide, and tantalum carbide, oxide such as alumina, silica, zirconia, nitride such as boron nitride, silicon nitride, titanium nitride, and cemented carbide mainly comprising tungsten carbide and cobalt and/or nickel or that additionally comprising titanium carbide and/or tantalum carbide. However, said examples which have small thermal expansion coefficient difference from the precipitated diamond on the base material are preferable and also from the viewpoints of economy and practicability, any one of molybdenum, tungsten, silicon, tungsten carbide, silicon carbide, silicon nitride, and cemented carbide mainly comprising tungsten carbide and cobalt is preferred as the base material on which the diamond coating is formed in the present invention.

In order to improve tenacious adhesion between the base material and the diamond coating formed on the surface by an anchoring effect, the surface of the base material mentioned above has a number of cavities provided in its surface (single pore, the pores which are intermittently connected, or a groove formed by the pores continuously connected to one another) having a depth of 0.0001–0.2 mm, preferably, 0.01–0.15 mm and a diameter of 0.001–0.2 mm, preferably, 0.01–0.1 mm.

These pores or cavities are formed at a number of points, lines (straight lines or curved lines), circles, ellipses, polygons, geometric patterns or combinations thereof, or at random. The geometric patterns formed by the pores, for example, may be arranged as zigzag at a constant pitch by points, circles, polygons or grooves formed by a series of pores continuously connected to one another, so as to form two kinds of parallel lines at the same distance, for example crossing at 90 degree angle with each other, and may form a groove of square stitch lattice. Moreover, a number of grooves may be arranged at random by polishing the surface of the base material with a diamond whetstone.

A depth of the pore of less than 0.0001 mm cannot obtain a sufficient anchoring effect and especially, in case of thick diamond coating formed, peeling of the coating easily occurs.

On the other hand, if the depth of the pore is over 0.2 mm, improvement effect of tenacious adhesion of the coating is maximum; therefore, it is not necessary to deepen the pores any further.

Also, in the case of forming pores by irradiation of YAG laser, it is difficult to produce a pore having a diameter less than 0.001 mm, even if the beam is focalized. However, if the diameter of the pore is over 0.2 mm, a sufficient anchoring effect cannot be obtained, therefore, peeling of the coating easily occurs.

Moreover, sufficient tenacious adhesion of the coating can be obtained when a pitch of single pore or geometric pattern, a distance of pores formed cavities, lattice, or a geometric pattern, or a long diameter of geometric pattern is not more than 5 mm length.

As mentioned above, by forming a number of pores on the surface of the base material whose depth is 0.0001–0.2 mm, tenacious adhesion between the surface of the base material and the diamond coating can be obtained by the anchoring effect.

As method to form pores on the surface of the base material, for example, a YAG laser is preferred to be used and another laser such as excimer laser and carbonic acid gas laser may be used, and another method such as diamond whetstone, ion beam, and photo-resist may be possible to use.

It is possible to use a base material whose surface for coating the diamond layer is precut by electric discharge such as wire electric discharge machining, and adhesion between the base material and the diamond coating becomes more tenacious by making pores on the surface as mentioned above.

Next, the diamond coating is formed on the surface of the base material mentioned above by rising vapor-phase synthesis in the source gas comprising hydrogen and hydrocarbon. Microwave plasma CVD, filament CVD, DC plasma CVD, and RF plasma CVD can be applied as vapor-phase synthesis, and microwave plasma CVD is preferable to the use for the present invention due to easy control of forming condition. Saturated hydrocarbon such as methane, ethane, propane, and butane, unsaturated hydrocarbon such as ethylene, propylene, and acetylene, alcohol such as methanol, butanol, and isopropanol, ketone such as acetone and methyl ethyl ketone, and aromatic compound such as benzene and toluene can be used as the hydrocarbon for a source of carbon in the source or working gas, and from the viewpoints of economy and practicability, the usage of methane is preferable. The hydrocarbon is mixed with hydrogen at a constant volume ratio. In some cases, it is possible to dilute the mixed gas by further mixing of inert gas such as argon. The mixed gas is supplied into the reaction chamber at a constant pressure. Microwave output power is applied in the source or working gas and the diamond coating is formed on the base material.

The diamond coated material obtained as mentioned above is used as it is covered with the diamond coating in case of whetstone tool usage. On the other hand, in case of cutting tool and wear resistant abrasion tool usage, the surface of the diamond coating is supplied after lapping.

EXAMPLES

Example 1

A cemented carbide of a diameter of 20 mm comprising 94% tungsten carbide and 6% cobalt was selected as a base material for the diamond coating and was cut off to a thickness of 0.7 mm by wire electric discharge machining.

Base materials were prepared having random arranged pattern (Pore No. 1), zigzag arranged pattern of points (Pore No. 2, 3) as shown in FIGS. 1–4, zigzag arranged pattern of circles (Pore No. 4, 5), rectangular lattice pattern (Pore No. 6, 7), or honeycomb pattern (Pore No. 8) described on the surface of the base material by YAG laser at the condition of Table 1 and a base material without forming pores for the base material of the diamond coating, respectively.

TABLE 1

Figure 2:
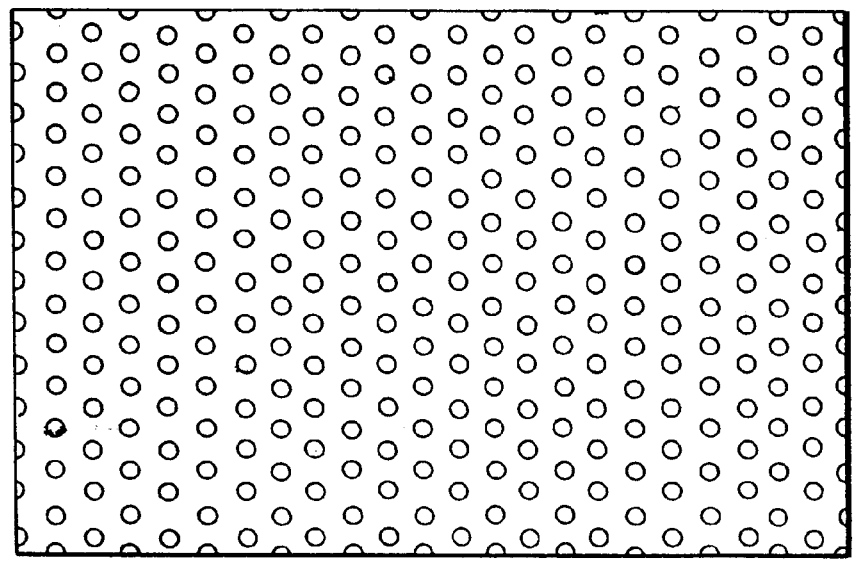
FIG. 2 is a pattern of circles arranged as zigzag which are illustrated on a base material.
Figure 3:
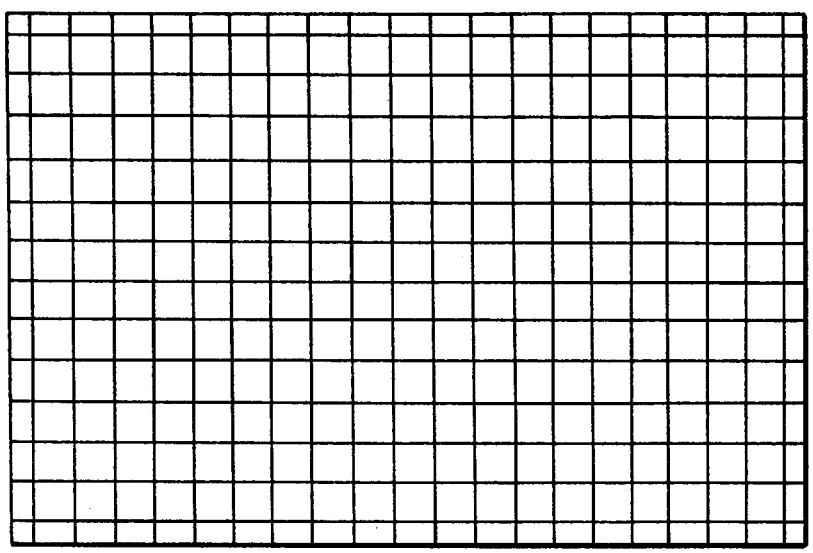
FIG. 3 is a pattern of rectangular lattices which are illustrated on a base material.
Figure 4:
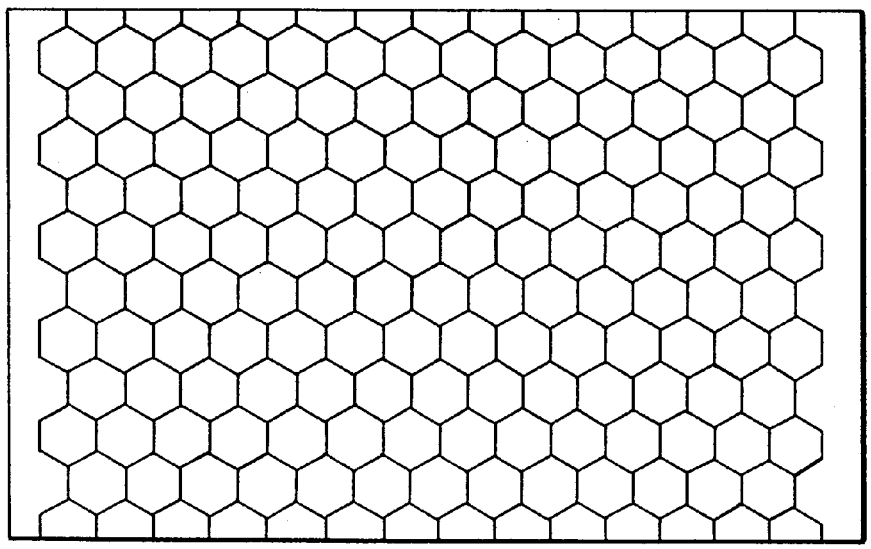
FIG. 4 is a pattern of honeycomb which are illustrated on a base material.

| Pore No. | Depth (mm) | Diameter of pore (mm) | Pattern shape | | Reference figure |
|---|---|---|---|---|---|
| 1 | 0.01 | 0.05 | Random (Polishing by diamond whetstone) | | |
| 2 | 0.00005 | 0.001 | Point (zigzag arrangement) | Distance of point is 0.5 mm. | FIG. 1 |
| 3 | 0.0001 | 0.005 | | Distance of point is 0.5 mm. | |
| 4 | 0.001 | 0.01 | Circle (zigzag arrangement) | diameter of circle = 2 mm distance between center of circle = 5 mm | FIG. 2 |
| 5 | 0.01 | 0.3 | | diameter of circle = 2 mm distance between center of circle = 10 mm | |
| 6 | 0.10 | 0.05 | Rectangular lattice | Distance of lattice = 3 mm | FIG. 3 |
| 7 | 0.18 | 0.13 | | Distance of lattice = 7 mm | |
| 8 | 0.10 | 0.10 | Honeycomb (length of one side = 3 mm) | | FIG. 4 |

These base materials were ultrasonic rinsed inacetone, then the diamond coating of a thickness of 0.25–0.3 mm was formed by microwave plasma CVD.

Warpage of the diamond coating obtained was measured as a maximum deviation (warpage) by two dimensional surface roughness meter and was evaluated by curvature diameter R calculated from the Pythagorean theorem.

Also, the adhesion between the diamond coating and the basic material was evaluated by visual inspection of the degree of peeling of the diamond coating formed. The results are shown in Table 2.

TABLE 2

| Sample No. | Base material Composition | Pore No. | Characteristic of diamond coating Diameter of curvature | Peeling of coating | Classification |
|---|---|---|---|---|---|
| 11 | Cemented | 7 | 690 | No | Present invention |
| 12 | carbide | 4 | 760 | No | Present invention |
| 13 | (94% WC + | 5 | 830 | No | Present invention |
| 14 | 6% Co) | 8 | 860 | No | Present invention |
| 15 | | 3 | 1220 | No | Present invention |
| 16 | | 6 | 1280 | No | Present invention |
| 17 | | 1 | 1310 | No | Present invention |
| 18 | | 2 | 1340 | No | Present invention |
| 19 | | — | Impossible measured | Overall | Comparative example |

(Measurement of curvature diameter)

Measurement equipment: two dimensional roughness meter Surfcom 1500 A manufactured by TOKYO SEIMITSU Co., Ltd.

Measurement method:

1. Measurement surface: a base material surface or a diamond coating surface precipitated 2. Measurement method and calculation way:

Warpage (maximum deviation: h) bewteen two point having a distance: L921) on a base material surface or a diamond coating surface was measured and a curvature diameter: R is calculated form the equation mentioned below using the Pythagorean theorem, that is to say, $$(R-h)^2+1^2=R^2; R=(1^2+h^2)/2h$$

If the value of R is smaller than 500, warpage of the diamond coating formed becomes larger, therefore, in the present invention, not more than 500 was the passing grade.

Example 2

A cemented carbide of a diameter of 20 mm comprising 99% tungsten carbide and 1% cobalt was selected for a base material of the diamond coating and was cutt off a thickness of 0.7 mm by diamond cutter, then the surface was polished as a mirror surface by surface grinding tool.

Next, the base material forming Pore No. 6 as shown in Table 1 by YAG laser and the base material without forming pores were produced for base materials of diamond coating, respectively. The base materials were ultrasonic rinsed in acetone, then the diamond coating of a thickness of 0.25–0.3 mm was formed by microwave plasma CVD at the same condition of example 1 described. Warpage (curvature diameter R) of the diamond coating obtained and the degree of peeling of the diamond coating formed are shown in Table 3.

TABLE 3

| Sample No. | Base material Composition | Pore No. | Characteristic of diamond coating Diameter of curvature | Peeling of coating | Classification |
|---|---|---|---|---|---|
| 20 | Cemented carbide | 6 | 770 | No | Present invention |
| 21 | (94% WC + 6% Co) | — | Impossible measured | Overall | Comparative example |

Example 3

Molybdenum, tungsten, tungsten carbide, and silicon carbide of diameter of 20 mm were selected for base materials of the diamond coating and were cut off a thickness of 0.6–0.7 mm by wire electric discharge machining. As in example 1, a base material forming Pore No. 3 and Pore No. 4 by YAG laser at the condition of Table 1 described above and a base material without forming pores were produced for the base material of the diamond coating, respectively.

The base materials were ultrasonic rinsed inacetone, then the diamond coating of a thickness of 0.25–0.3 mm was formed by microwave plasma CVD at the same condition of Example 1 described above. Warpage (curvature diameter R) of the diamond coating of a thickness of 0.25–0.3 mm was formed by microwave plasma CVD at the same condition of example 1 described. Warpage (curvature diameter R) of the diamond coating obtained and the degree of peeling of the diamond coating formed are shown in Tables 4 and 5.

TABLE 4

| Sample No. | Base material Composition | Pore No. | Characteristic of diamond coating Diameter of curvature | Peeling of coating | Classification |
|---|---|---|---|---|---|
| 22 | Molybdenum (Mo) | 3 | 630 | No | Present invention |
| 23 | | — | Impossible measured | Overall | Comparative example |
| 24 | Tungsten (W) | 3 | 600 | No | Present invention |
| 25 | | — | Impossible measured | Overall | Comparative example |

TABLE 5

| Sample No. | Base material Composition | Pore No. | Characteristic of diamond coating Diameter of curvature | Peeling of coating | Classification |
|---|---|---|---|---|---|
| 26 | Tungsten carbide | 4 | 810 | No | Present invention |
| 27 | (WC) | — | Impossible measured | Overall | Comparative example |
| 28 | Silicon carbide | 4 | 660 | No | Present invention |
| 29 | (SiC) | — | Impossible measured | Overall | Comparative example |

Example 4

Commercial silicon wafer and silicon nitride water of a thickness of 1 mm were selected for a base material of the diamond coating and were cutt off a square of 30 mm. As same as Example 1, a base material forming Pore No. 8 by YAG laser at the condition of Table 1 described and a base material without forming pores were produced for the base material of the diamond coating, respectively.

The base materials were ultrasonic rinsed into acetone, then the diamond coating of a thickness of 0.25–0.3 mm was formed by microwave plasma CVD at the same condition of Example 1 described. Warpage (curvature diameter R) of the diamond coating obtained and the degree of peeling of the diamond coating formed are shown in Table 6.

TABLE 6

| Sample No. | Base material Composition | Pore No. | Characteristic of diamond coating wafer Diameter of curvature | Peeling of coating | Classification |
|---|---|---|---|---|---|
| 30 | Silicon (Si) | 8 | 770 | No | Present invention |
| 31 | | — | Impossible measured | Overall | Comparative example |
| 32 | Silicon nitride | 8 | 920 | No | Present invention |
| 33 | (Si$_3$N$_4$) | — | Impossible measured | Overall | Comparative example |

As shown in examples, the diamond coating of little warpage and flat shape was obtained on the surface of the base material by diamond whetstone of YANG layer. A tenaciously adherent diamond coating was also obtained.

As mentioned above, it is possible to provide a tenaciously adherent coating made by forming a diamond coating on a base material by vapor-synthesis without causing by warpage to the coating by the present invention.

We claim:

1. A diamond coated material having a diamond coating layer formed by vapor-phase synthesis on a surface of a base material having a number of cavities.

2. A diamond coated material as claimed in claim 1, wherein said cavities are formed by electric discharge or laser beam.

3. A diamond coated material as claimed in claim 2 wherein said cavities are pores having a depth of 0.0001–0.2 mm and a diameter of 0.001–0.2 mm.

4. A diamond coated material as claimed in claim 3, wherein said base material is any one of molybdenum, tungsten, silicon, tungsten carbide, silicon carbide, silicon nitride, and cemented carbide mainly comprising tungsten carbide and at least one of cobalt and nickel.

5. A diamond coated material as claimed in claim 2 wherein said cavities are pores having a depth of 0.01–0.15 mm and a diameter of 0.01–0.1 mm.

6. A diamond coated material as claimed in claim 5, wherein said base material is any one of molybdenum, tungsten, silicon, tungsten carbide, silicon carbide, silicon nitride, and cemented carbide mainly comprising tungsten carbide and at least one of cobalt and nickel.

7. A diamond coated material as claimed in claim 2, wherein said base material is any one of molybdenum, tungsten, silicon, tungsten carbide, silicon carbide, silicon nitride, and cemented carbide mainly comprising tungsten carbide and at least one of cobalt and nickel.

8. A diamond coated material as claimed in claim 1, wherein said cavities are having a depth of 0.0001–0.2 mm and a diameter of 0.001–0.2 mm.

9. A diamond coated material as claimed in claim 8, wherein said pores are connected to one another to form a groove.

10. A diamond coated material as claimed in claim 9, wherein said base material is any one of molybdenum, tungsten, silicon, tungsten carbide, silicon carbide, silicon nitride, and cemented carbide mainly comprising tungsten carbide and at least one of cobalt and nickel.

11. A diamond coated material as claimed in claim 8, wherein said base material is any one of molybdenum, tungsten, silicon, tungsten carbide, silicon carbide, silicon nitride, and cemented carbide mainly comprising tungsten carbide and at least one of cobalt and nickel.

12. A diamond coated material as claimed in claim 1, wherein said cavities are having a depth of 0.01–0.15 mm and a diameter of 0.01–0.1 mm.

13. A diamond coated material as claimed in claim 12 wherein said pores are connected to one another to form a groove.

14. A diamond coated material as claimed in claim 13, wherein said base material is any one of molybdenum, tungsten, silicon, tungsten carbide, silicon carbide, silicon nitride, and cemented carbide mainly comprising tungsten carbide and at least one of cobalt and nickel.

15. A diamond coated material as claimed in claim 12, wherein said base material is any one of molybdenum, tungsten, silicon, tungsten carbide, silicon carbide, silicon nitride, and cemented carbide mainly comprising tungsten carbide and at least one of cobalt and nickel.

16. A diamond coated material as claimed in claim 1, wherein said base material is any one of molybdenum, tungsten, silicon, tungsten carbide, silicon carbide, silicon nitride, and cemented carbide mainly comprising tungsten carbide and at least one of cobalt and nickel.

17. A tool comprising a working surface formed of a unitary solid flat base material layer selected from the group consisting of molybdenum, tungsten, silicon, tungsten carbide, silicon carbide, silicon nitride, and cemented carbide consisting essentially of tungsten carbide together with at least one of cobalt and nickel, said base material layer having a porous upper surface with pores having a diameter of 0.001–0.2 mm and a depth of 0.001–0.2 mm, and a diamond coating over said base material layer and extending into said pores.

* * * * *